(12) United States Patent
Bowman et al.

(10) Patent No.: US 6,309,279 B1
(45) Date of Patent: Oct. 30, 2001

(54) ARRANGEMENTS FOR WAFER POLISHING

(75) Inventors: Mike L. Bowman, Chandler; Gene Hempel, Gilbert; Chris Karlsrud, Chandler; Franklin D. Root, Phoenix, all of AZ (US)

(73) Assignee: Speedfam-IPEC Corporation, Chandler, AZ (US)

( * ) Notice: Subject to any disclaimer, the term of this patent is extended or adjusted under 35 U.S.C. 154(b) by 0 days.

(21) Appl. No.: 09/253,438

(22) Filed: Feb. 19, 1999

(51) Int. Cl.[7] .............................. B24B 1/00; B24B 5/00; B24B 7/19
(52) U.S. Cl. .................. 451/41; 451/5; 451/66; 451/288
(58) Field of Search .................. 451/41, 5, 65, 451/66, 288

(56) References Cited

U.S. PATENT DOCUMENTS

| | | | |
|---|---|---|---|
| 5,081,733 | 1/1992 | Kudo | 15/77 |
| 5,092,011 | 3/1992 | Gommori et al. | 15/88.2 |
| 5,317,778 | 6/1994 | Kudo et al. | 15/88.3 |
| 5,329,732 | 7/1994 | Karlsrud et al. | 51/131.5 |
| 5,361,545 | 11/1994 | Nakamura | 451/287 |
| 5,442,828 | 8/1995 | Lutz | 15/88.3 |
| 5,498,196 | 3/1996 | Karlsrud et al. | 451/11 |
| 5,498,199 | 3/1996 | Karlsrud et al. | 451/289 |
| 5,529,638 | 6/1996 | Lutz | 134/6 |
| 5,551,459 | 9/1996 | Ohmori et al. | 134/61 |
| 5,554,065 | 9/1996 | Clover | 451/283 |
| 5,582,534 * | 12/1996 | Shendon et al. | 451/41 |
| 5,616,063 * | 4/1997 | Okumura et al. | 451/1 |
| 5,618,227 | 4/1997 | Tsutsumi et al. | 451/288 |
| 5,655,954 * | 8/1997 | Oishi et al. | 451/67 |
| 5,700,046 | 12/1997 | Van Doren et al. | 294/119.1 |
| 5,730,642 | 3/1998 | Sandhu et al. | 4511/6 |
| 5,738,574 * | 4/1998 | Tolles et al. | 451/288 |
| 5,830,045 * | 11/1998 | Togawa et al. | 451/288 |
| 5,905,611 * | 5/1999 | Yoda et al. | 360/113 |
| 5,957,764 | 9/1999 | Anderson et al. | 451/285 |
| 5,967,881 | 10/1999 | Tucker | 451/41 |
| 6,036,582 | 3/2000 | Aizawa et al. | 451/41 |
| 6,042,455 | 3/2000 | Togawa et al. | 451/8 |
| 6,048,259 * | 4/2000 | Asai | 451/339 |
| 6,050,884 * | 4/2000 | Togawa et al. | 451/67 |

FOREIGN PATENT DOCUMENTS

| | | |
|---|---|---|
| 0 761 387 A1 | 3/1997 | (EP). |
| 0 792 721 A1 | 9/1997 | (EP). |
| 0 803 328 A1 | 10/1997 | (EP). |
| 0 807 492 A2 | 11/1997 | (EP). |

* cited by examiner

Primary Examiner—Allen M. Ostrager
Assistant Examiner—William Hong
(74) Attorney, Agent, or Firm—Fitch, Even, Tabin & Flannery

(57) ABSTRACT

Wafer polishing systems include a series of polish modules alongside a neighboring series of secondary modules. A conveyor travels along the series of polish modules and the series of secondary modules. When a polishing operation is completed, the wafers are transferred to a series of near-by storage modules. The polish modules include a pair of traveling wafer gantries, each of which delivers a wafer to a polishing surface, applying the necessary force to complete polishing of the wafer surface.

31 Claims, 14 Drawing Sheets

ARRANGEMENTS FOR WAFER POLISHING

BACKGROUND OF THE INVENTION

1. Field of the Invention

The present invention pertains to the polishing of wafers, especially wafers of semiconductor material bearing electronic circuit elements.

2. Description of the Related Art

The production of semiconductor devices, such as integrated circuits, begins with the preparation of high quality raw semiconductor wafers. Because of the relative purity of the semiconductor material, even the raw, unprocessed semiconductor wafers have a substantial cost. Thin layers of expensive materials are then stacked on top of a raw silicon wafer and then on top of one another in succession. A variety of carefully controlled operations such as metalization, sputtering, and ion implantation are used to form the respective layers. The thickness of the layers is relatively small, typically on the on the order of several molecular dimensions.

During integrated circuit production, as circuit layers are successively stacked one on top of the other, an extremely flat working surface is required at each stage in the wafer production. Flatness is attained by polishing on a platen, typically in the presence of a chemical medium, and thus the polishing processes are typically referred to as chemical/mechanical polishing (CMP). The semiconductor wafers, because of their material composition and relatively thin dimensions, are fragile, susceptible to damage by overbending and chipping caused by inadvertent contact with the wafer edge. As mentioned, at each stage in the wafer production process, the wafers must be transferred to polishing equipment, to be polished to a flatness defined by ever increasingly demanding tolerances. For example, wafer flatness has, in the past, been typically held to 120 micro inches or less over the entire surface of a wafer of 8-inch diameter. Recently, the same numerical flatness requirements have been applied to a new generation of wafers of approximately 12 inches or 300 millimeters in diameter. Thus, for this reason alone, the polishing tolerances are becoming increasingly stringent. Further, it is expected that the industry will require more complete utilization of the wafer surface, even to the extreme edge regions of the wafer.

After polishing to achieve a desired flat working surface, a new layer of circuit structures is formed on the wafer so as to become mechanically and eventually electronically linked to underlying layers, now incorporated in the growing wafer body. Layer formation techniques typically involve depositing films on the wafer surface, in order to selectively confine the next layer addition to carefully defined portions of the wafer surface. When no longer needed, such films are routinely removed using a variety of chemically active solutions.

A need has arisen, from time to time, to provide isolation of wafers during their preparation. One concern is the possibility of introducing particles or droplets of unwanted material from one wafer to another. For example, wafers, and particularly wafer surfaces, have chemical reactivities which vary widely from the conditions at one stage of preparation to another. Such problems may arise when different types of chemistries are employed to remove a film from a previous operation, or to prepare a wafer surface for a subsequent operation, for example. The different chemistries themselves may be incompatible with one another, and accordingly, a chemical isolation is required throughout the various steps of wafer handling and processing. Particles generated in a cleaning, buffing or scrubbing of one wafer must not be allowed to transfer to other wafers, particularly those which are regarded as "clean" and not requiring further preparations before carrying out the next production step. Thus, the need arises to provide polishing systems of greater flexibility and adaptability for different materials and processes.

SUMMARY OF THE INVENTION

It is an object of the present invention to provide polishing systems for semiconductor wafers.

Another object of the present invention is to provide polishing systems providing the needed environmental protection for reactive wafer materials.

Yet another object of the present invention is to provide polishing systems which allow for a more intensive use of polishing surfaces.

A further object of the present invention is to provide polishing systems having increased flexibility of operation.

A further object of the present invention is to provide polishing systems employing modular components suitable for ready replacement or reconfiguration of the wafer polishing system.

These and other objects according to principles of the present invention are provided in wafer polishing apparatus, comprising:

a linear array of polish modules having respective platen arrangements independently operable with respect to one another, the linear array of polish modules having opposed first and second ends;

a linear array of secondary modules for treating exposed surfaces of said wafers, located alongside said linear array of polish modules, said secondary modules independently operable with respect to one another and the linear array of secondary modules having opposed first and second ends, with the first end adjacent the first end of said linear array of polish modules;

wafer storage means adjacent the first ends of said linear arrays of said polish modules and said secondary modules;

first automated wafer handling means for transporting wafers between said wafer storage means and the first end of at least one of said linear array of polish modules and said linear array of secondary modules; and second automated wafer handling means for transporting wafers between said linear array of polish modules and said linear array of secondary modules, for transporting wafers between said polish modules and for transporting wafers between said secondary modules.

Other objects of the present invention are attained in a method for polishing wafers, comprising:

providing a plurality of polish modules having respective wafer support arrangements independently operable with respect to one another;

arranging said polish modules in a linear array having opposed first and second ends;

providing a plurality of secondary modules for treating exposed surfaces of said wafers, said secondary modules independently operable with respect to one another;

arranging said secondary modules in a linear array having opposed first and second ends;

positioning said linear array of secondary modules alongside said linear array of polish modules, with the first end of said linear array of secondary modules adjacent the first end of said linear array of polish modules;

providing a plurality of automated wafer handling means for transporting wafers between ones of said polish modules and said secondary modules.

mounting said first automated wafer handling means for travel along substantially the entire length of both said linear array of polish modules and said linear array of secondary modules; and transporting wafers with said first automated wafer handling means between ones of said polish modules and said secondary modules.

DETAILED DESCRIPTION OF THE PREFERRED EMBODIMENTS

Figure 1:
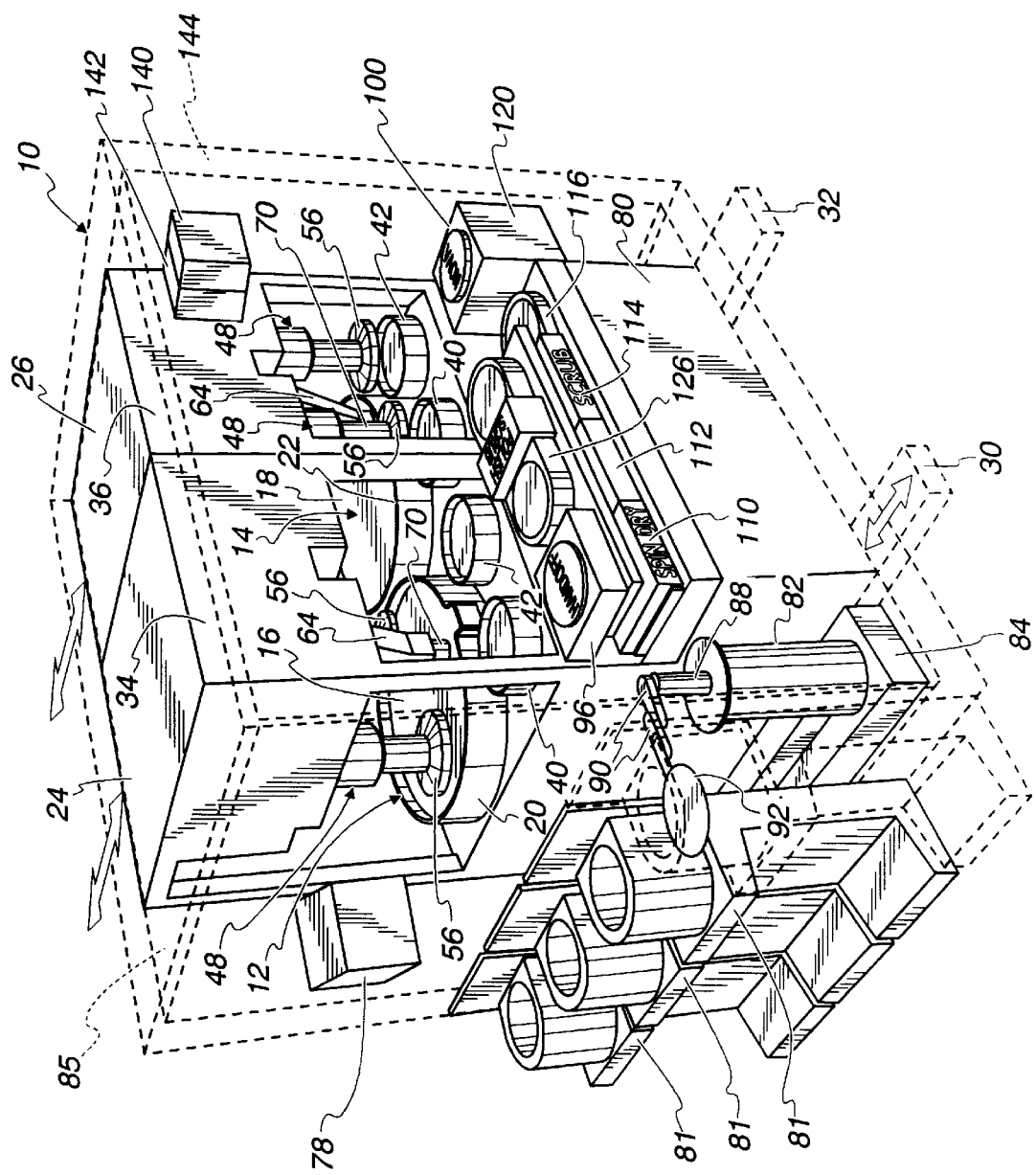
FIG. 1 is a perspective view of a polishing arrangement according to principles of the present invention.
Figure 2:
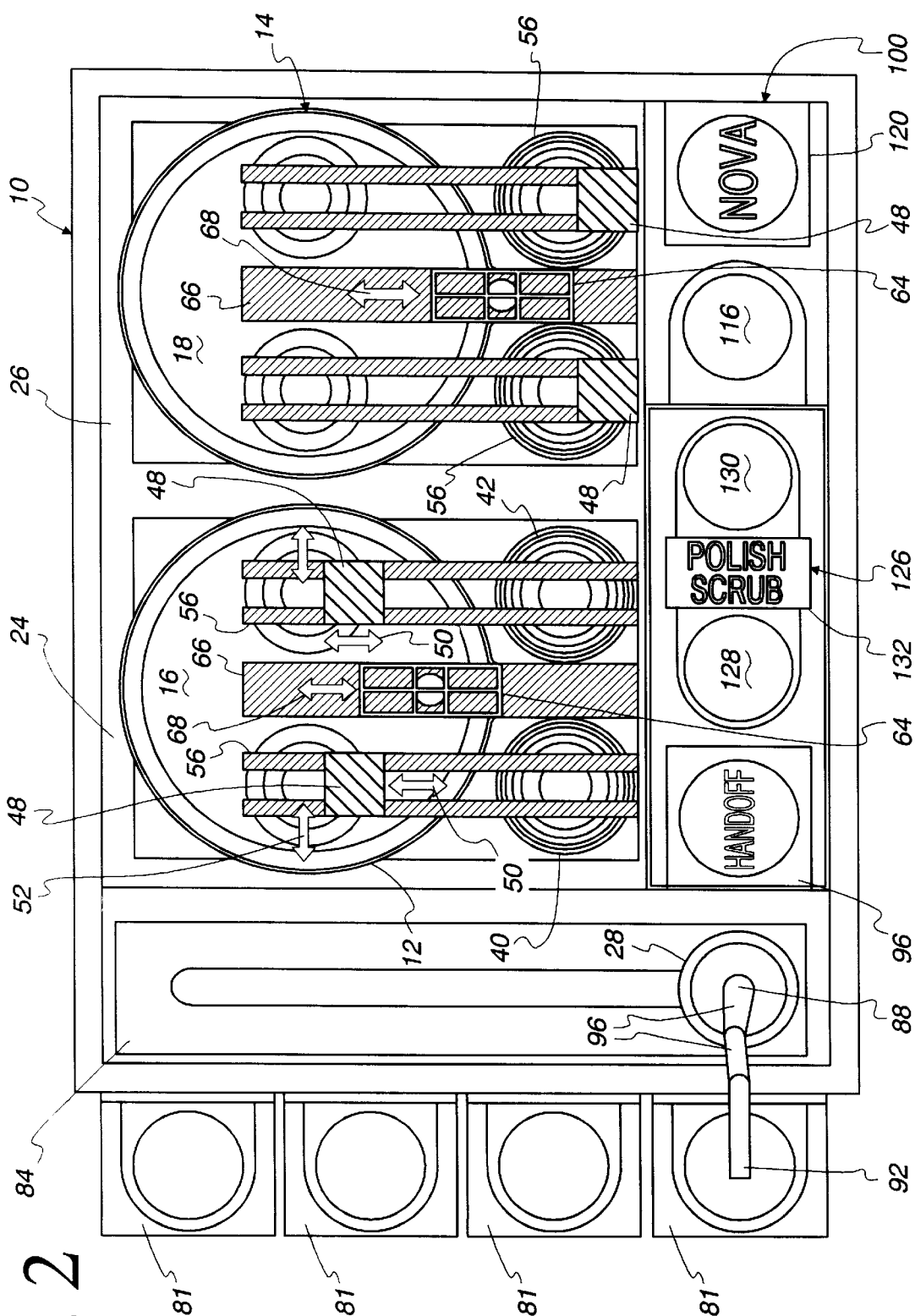
FIG. 2 is a top plan view thereof.

Referring now to the drawings, and initially to FIGS. 1 and 2, wafer processing apparatus according to principles of the present invention is generally indicated at 10. As will be seen herein, apparatus 10 is provided for performing a number of varied operations in a commercial wafer production environment. Apparatus 10 include two platen arrangements 12, 14 which include polishing surfaces 16, 18 and upstanding outer walls 20, 22 rising slightly above the working surfaces 16, 18 for slurry containment. The platen arrangements 12, 14 are located within respective polishing modules 24, 26. The modules 24, 26 are separate and independent from one another and are connected with a "backbone" or "docking" structure enclosed in a cabinet 80. Preferably, the "backbone" includes a framework (with valves and switches) supporting a plurality of flexible hoses for gas and liquid, and flexible cables for electrical power and electrical signals. The hoses and cables are connected to nearby modules 24, 26 and the modules are thereafter moved to the final positions illustrated, for example, in FIG. 1. Optionally, interfitting connectors, such as the connectors 272 illustrated in FIG. 9, may be employed.

Modules 24, 26 and the cabinet 80 are preferably mounted on caster wheels (not shown) but may also be mounted on optional sliding tracks 30, 32, as shown, for example, in FIG. 1.

Each module 24, 26 is preferably enclosed either by solid walls which are not shown in FIG. 1 for the purpose of clarity, or fluid walls, in the form of an air curtain preferably employed adjacent the front faces 34, 36 of modules 24, 26, respectively.

Associated with each module 24, 26 are multiple (preferably at least two) load cups 40, 42 located adjacent the front face of each module. Each module 24, 26 has a pair of wafer gantries generally indicated at 48. With reference to FIG. 2, the wafer gantries 48 are movable in an "X" direction indicated by arrows 50 and are telescopically extendable in a vertical, Z direction toward and away from the polish surface. Further, wafer gantries 48 are movable in a "Y" direction indicated by arrow 52 in FIG. 2. Wafer carriers 56, preferably of conventional construction, are located at the lower ends of the wafer gantries 48.

Preferably, the wafer gantries 48 are independently movable with respect to one another so as to be capable of simultaneously carrying out different operations. For example, the wafer gantries 48 of each respective module 24, 26 may be operated under control of computer module 78 (see FIG. 1) in either a staggered mode or in a simultaneous fashion, that is in unison with one another. For example, referring to FIG. 2, wafer gantries 48 are operated such that the wafer carriers are shown located in position over platen arrangement 12, applying the requisite down force to perform desired polishing of wafers (held by carriers 56) against working surface 16 of polish platen 12. The wafer gantries 48 are preferably mounted at the upper end of the respective modules 24, 26.

Figure 11:
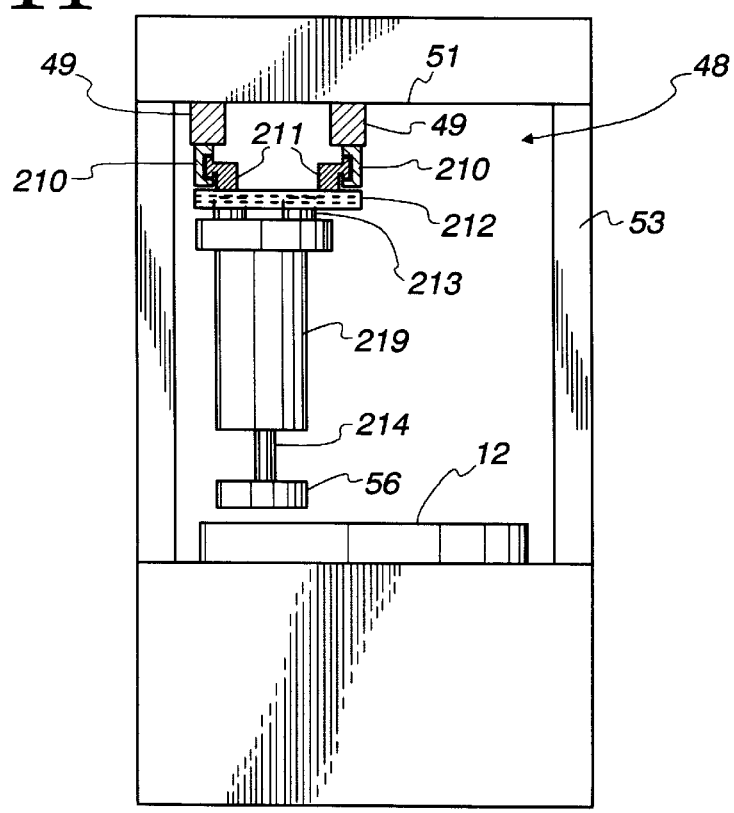
FIG. 11 is a schematic elevational view taken along the line 11—11 of FIG. 5.

The wafer gantries are preferably of conventional construction, and a typical operation will be explained below with reference to FIG. 11. Additional examples of wafer gantries are found in commercial units, such as Model SSP434 sold by SpeedFam K. K., located in Japan of Model PM-300 "Apollo" sold by Peter Wolters Company located in Germany, and may, for example, comprise an X-Y track on which the wafer gantries and wafer carrier are mounted. Preferably, as will be seen herein, linear (X-direction) tracks may be provided for movement in the direction of arrows 50 and automated handlers in the form of linear rollers or possibly robotic manipulators can be mounted to the linear tracks to provide Y-direction movement in a direction of arrow 52. The wafer gantries (with their overhead track mounting) provide movement of the wafer carriers with two degrees of freedom across the working surface 16, 18 of the platen assemblies 12, 14, respectively.

Associated with each polish module 24, 26 is an overhead-mounted pad conditioner gantry 64. The pad conditioner gantries 64 are preferably mounted on overhead tracks 66 for linear reciprocation in an X-direction, as indicated by arrows 68. The pad conditioner gantries 64 have conditioning elements at their lower ends 70, which are telescopically movable in a vertical Z-direction to develop pressure against working surfaces 16, 18 of polish platens 12, 14, respectively. Most preferably, the pad conditioner gantries 64 are mounted for linear, non-swinging movement, while allowing the working ends 70 full travel over the entire surface of the polish platens.

Preferably, the working surface of the polish platen (preferably in the form of a conventional polish pad) is conditioned by elements 70 during a polishing operation. Conditioning of the working surface of the platen assembly is carried out, principally, to control the profile of the working surface, so as to enhance the polishing process. Alternatively, the working surface may be conditioned between polishing operations although a delay during conditioning may effectively reduce wafer throughput.

Referring again to FIG. 2, the wafer gantries 48 are movable to bring the wafer carriers 56 to a polishing position, in contact with working surface 16 of polish module 24. Preferably, the polish modules 24, 26 are capable of separate independent operation and, as shown in FIG. 2, the wafer gantries 48 are movable so as to position the wafer carriers above load cups 40, 42 (see FIG. 1), thus leaving the working surface 18, temporarily in an idle condition. If desired, conditioning gantry 64 may be advanced toward the center of working surface 18 to perform a conditioning operation during the idle condition, although this has not been found to be necessary in most operations.

Alternatively, each individual wafer gantry of each polish module can be independently operated. For example, a first wafer gantry of a particular polishing module may be located over a load cup to drop off a polish wafer and await acquisition of a fresh, unpolished wafer. At the same time, the neighboring wafer gantry of the same polish module can be located over the working surface of the platen arrangement, carrying out an uninterrupted polishing operation in a "staggered" operating mode. Such staggered polishing operations may be employed to minimize robot handling down time (that is, that portion of the total wafer processing time required for transferring wafers between operating stations). To further reduce robot handling down time, it is preferred (although not necessary) that the platen arrangements be continuously rotated, even while wafers are brought into contact with, or removed from the working surface of the polish platen. The track-mounted wafer gantry arrangements that have been studied have been found to provide the required rigidity for wafer polishing, while allowing wafers to be landed on and lifted off of a spinning polish platen surface. One important advantage obtainable with polish module arrangements according to the present invention is that lift-off from a spinning polish platen surface is accomplished with reduced stiction problems, thus contributing to a reliable automated operation. Also, overall throughput of wafers can be dramatically improved, especially for staggered modes of operation. The present invention provides the same advantages for polishing belts and the like which do not undergo a spinning motion.

In the preferred embodiment, a variety of secondary modules are located (preferably in a linear array) atop a sliding cabinet 80, which is movable back and forth along rails 30, 32. Cabinet 80 provides support for the weight of the secondary modules, and also contains a backbone or docking connection not only for the secondary modules, but also for polish modules 24, 26.

Located within cabinet 80 are utilities for the secondary modules and polishing modules to provide electrical power, water, slurry and other fluids, as well as pressurized air and gas sources, as may be required for the respective modules. Also, included in cabinet 80 are control busses for connection to each polish module and secondary module to allow centralized computer control 78 located in the so-called "dry region" of apparatus 10 indicated by reference numeral 85. Preferably, the control busses are provided for sensors, serial and parallel data transmission and motor controls. Before the polish modules 24 or 26 are slid into final position, connection is made with the respective required utilities located within cabinet 80 (see connectors 272 of FIG. 9). In a similar manner, connection is provided for the various secondary modules, to facilities located within cabinet 80.

Referring again to FIGS. 1 and 2, apparatus 10 includes a series of storage modules 81 arranged in a linear array, generally perpendicular to the front faces 34, 36 of the polish modules. The storage modules 81 are mobile, for batch transport of wafers, and preferably provide a controlled environment for the wafers. Preferably, the storage modules are of a type described by the technical term "box", referring to an environmentally-controlled enclosure for a cassette containing wafers, also referred to as a "container". Reference is made in this regard to SEMI specification E19-91. An automated handler, preferably in the form of a movable robot 82, is mounted on a linear track 84 and so as to pass across the array of storage modules. Preferably, robot 82 is bottom mounted to track 84 and has an upper operating rod 88 and a plurality of interconnected operating arms 90. The outermost arm includes a conventional end effector 92 adapted for the selective acquisition and release of wafers contained in the storage modules 81 and is rotated by shaft 88 so as to swing end effector 92 over module 96.

As shown in FIGS. 1 and 2, a linear array 100 of secondary modules is mounted on cabinet 80, so as to extend across the front faces 34, 36 of the polish modules. The secondary modules accomplish a number of varied operations complementing the polishing operations carried out on platen assemblies 12, 14. The secondary modules may include, for example, devices for rinsing, drying, scrubbing, chemical cleaning or chemical etching of semiconductor wafers. The secondary modules may also comprise instrumentation such as wet or dry metrology equipment. A wafer support module 96, as mentioned, receives wafers for distribution throughout polishing apparatus 10. Automated wafer handling apparatus selectively moves the semiconductor wafers throughout the polishing apparatus, between the polish modules and secondary modules, and also from one secondary module to another, as may be required.

Figure 12:
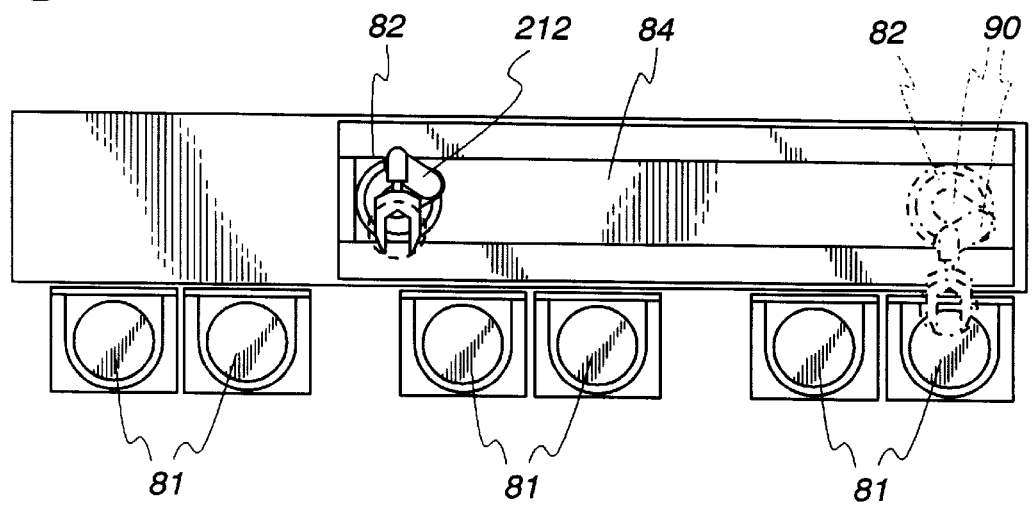
FIG. 12 is a fragmentary top plan view thereof.

FIG. 12 is an overhead view showing the movable robot 82 mounted for travel back and forth along linear track 84. The arms 90 are extendable and retractable in the manner indicated so as to reach into close spaces, such as the storage modules 81, which store the wafers in a vertically spaced array within an enclosed, environmentally controlled cabinet interior.

Figure 13:
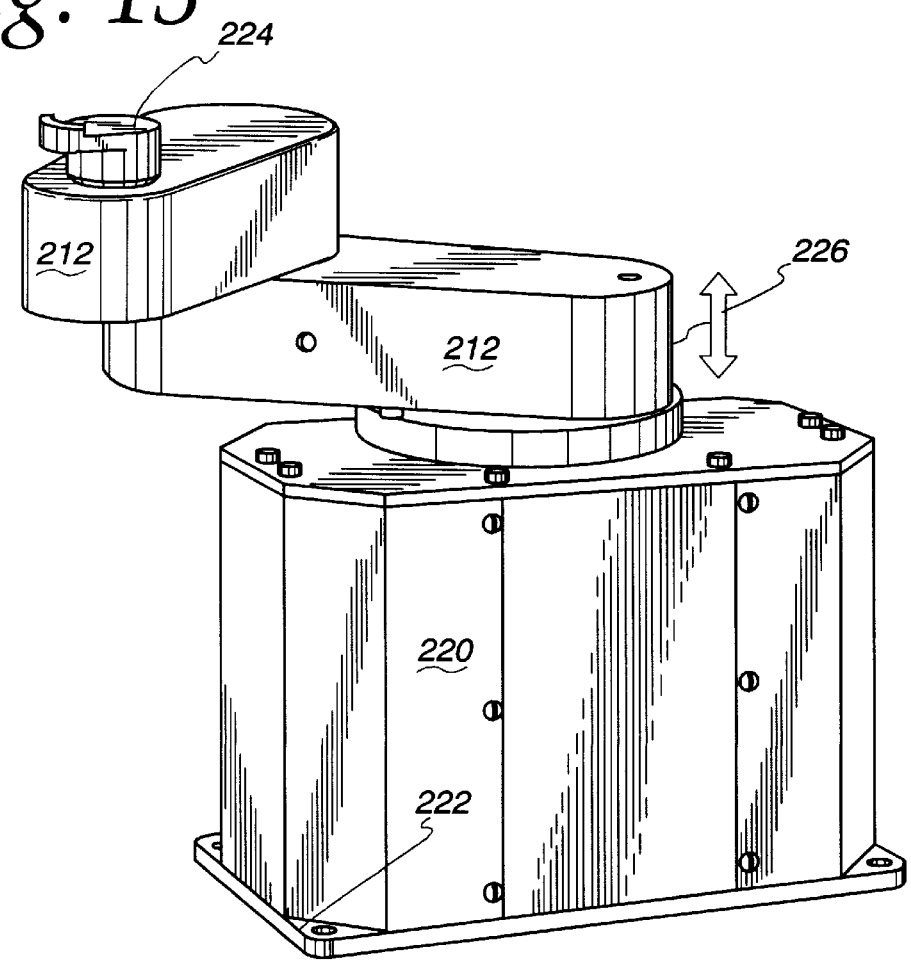
FIG. 13 is a perspective view of an automated transfer module.

FIG. 13 shows an alternative arrangement of an automated robot handler generally indicated at 220. The robot handler has a mounting end 222 for mounting either to a stationary position or to a slidable track, such as the linear track 84, shown in FIGS. 1 and 12. Robot arms 212 are pivotally mounted to one another and to body 220, as is conventionally known. An end effector for acquiring a wafer either by edge gripping or by vacuum is not shown is FIG. 13, but when provided, is mounted at 224, so as to be carried at the free end of the robot arms 212. The robot arms 212 are in turn connected to an operating mechanism with end body portion 220 by a vertical shaft (not visible in FIG. 13) which is extendable in a vertical direction indicated by arrow 226.

The automated handler shown in FIG. 13 might be employed in place of robot 82, as mentioned. However, a further alternative is also possible. Preferably, as indicated in FIG. 2, the array of secondary modules is closely spaced with respect to the linear array of polish modules. This provides a compact "footprint" in expensive clean room of environments. However, if desired, the array of secondary modules could be spaced apart from the array of polish modules if additional wafer handling is required. For example, a linear track similar to the linear track 84 may be interposed between the linear arrays of polish modules and secondary modules and an automated handler similar to that shown in FIG. 13 could be made to traverse the polish apparatus, as required.

Alternatively, the automated handler may be positioned in a stationary manner at a fixed position between the secondary modules and the polish modules. These arrangements have, in general, been found unnecessary although additional automated handlers may be needed on occasion to increase throughput through the polish apparatus or to provide convenient solutions for wafer handling problems (such as those encountered when "handing off" a wafer from one module to another in an operation which may require, for example, wafer inversion). Additional automated handling apparatus may be needed to avoid cross-contamination problems which may be encountered.

Referring again to FIG. 1, the secondary module array 100 preferably includes a conventional spin-rinse-dry module 110 for performing a final operation on the fully processed wafers, before the completed wafers are acquired by robot 82 for storage in modules 81. A conventional rinse module 112 and an adjacent scrub module 114 are mounted along with spin-dry module 110 and wafer support module 96 on the upper portion of cabinet 80. Various types of scrubbing operations are contemplated with the present invention and a second, optional scrub module 126 is located alongside wafer support module 96. Referring to FIG. 2, scrub module 126 includes a scrubber portion 132 located between wafer support portions 128, 130 located at the output and input of the scrub module 126, respectively. Both surfaces of the wafers are simultaneously processed in scrub module 126 as may be required during a polishing operation, and prior to a final sequence of secondary operations initiated with delivery of a wafer to wafer support portion 116.

The scrubber portion 132 preferably comprises a conventional "roller box" of a type typically employed with a pair of generally co-extensive shafts carrying cleaning brushes. Wafers are passed through the nip between the brushes. The brushes are replaced with tubular sleeves made of commercial wafer polish buff or the like surface treatment material. Presently, a wide variety of wafer polish materials are available for the purpose and can be readily rolled into a tubular form so as to be carried on the shafts. The shafts are movable toward and away from one another and a wafer to be processed is passed through the nip formed between the rollers. The shafts carrying the sleeves could be made to rotate in the same direction, in counter directions, and the shafts could be rotated at differing speeds, as well, depending upon the desired cleaning effect. With tubes formed of more aggressive wafer treatment materials, it is possible to perform a buffing operation on the wafers. If desired, dispense manifolds may be provided along the length of the sleeves, to dispense slurry, or chemicals, as may be beneficial for the wafer treatment. The dispense manifolds can apply material through drip or spray heads on the rollers, or directly on the wafer surfaces, or both.

Figure 3:
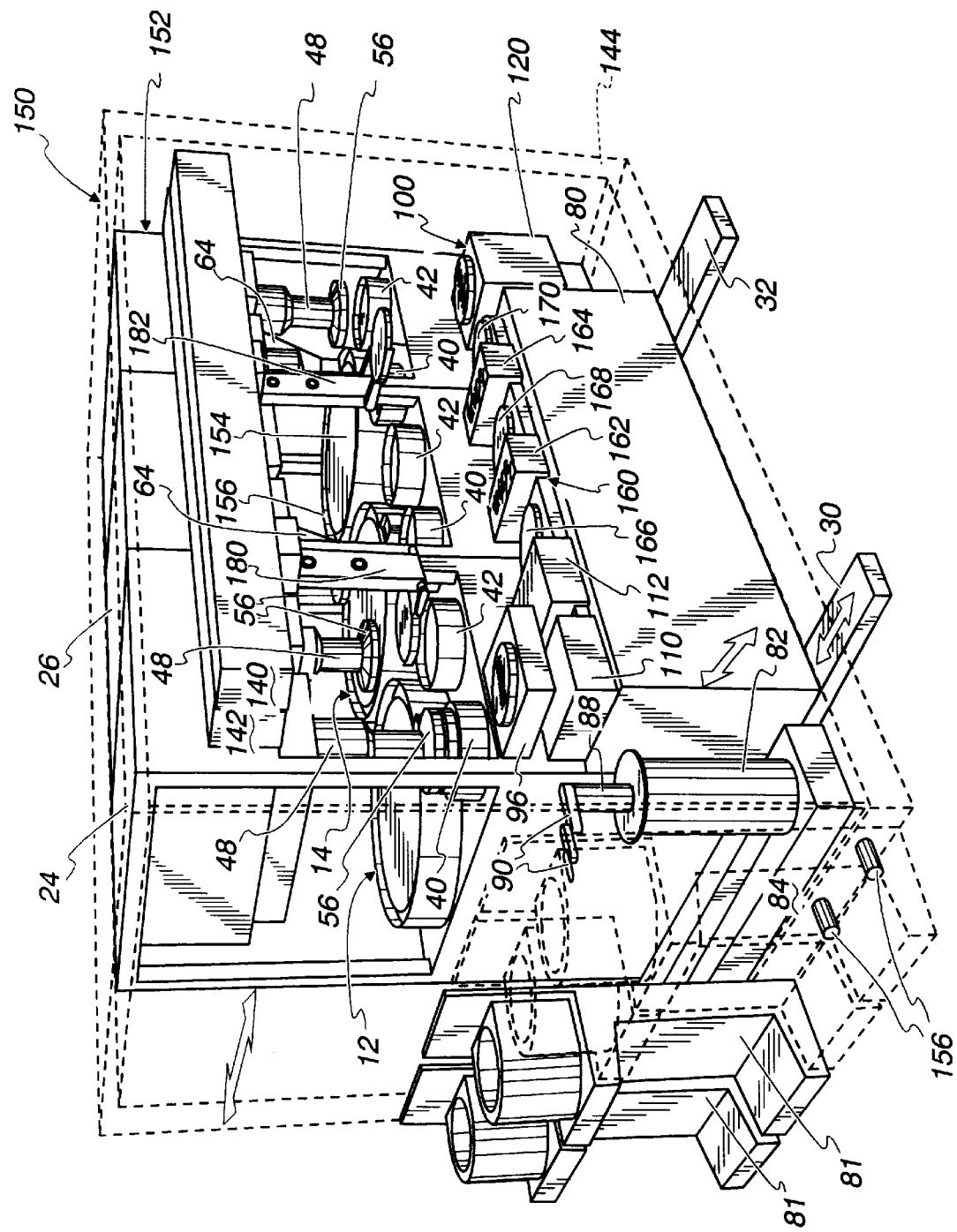
FIG. 3 is a perspective view of an alternative polishing arrangement according to the principles of the present invention.

As shown in FIG. 2, an input wafer support portion 116 for scrub module 114 is accessible from overhead mounted wafer handling devices, such as automated wafer handlers 180, 182 shown in FIG. 3. In the preferred embodiment, the scrub module 114, rinse module 112 and spin-dry module 110 include wafer tractor means for acquiring and moving a wafer to the respective secondary modules, thus eliminating the need for external wafer handling devices for moving the wafers from one secondary module to another. Upon completion of the spin-rinse-dry operation, module 110 makes a wafer available to the end effector of robot 82.

In general, the various secondary modules in array 100 complement the actual polishing operations carried out on surfaces 16, 18, and the secondary modules described above are representative of well known commercially available modules. The modular, flexible construction of the present invention allows secondary modules to be readily exchanged as particular needs arise. As will be appreciated, the secondary modules in array 100 can be accessed individually, in virtually any order, as may be required, during processing of a wafer. For example, a wafer may be removed from polish surface 16 to a load cup 40 or 42 and then transferred to one of the secondary modules by automated wafer handlers such as the overhead mounted robot arms 180, 182 shown in FIG. 3. Preferably, one robot arm is provided for clean-wet wafers and the other robot arm is provided for wet-dirty wafers.

A conventional metrology module 120 is mounted at the far end of array 100 and is employed at various stages during wafer processing to provide input signals to computer control module 78, shown in FIG. 1, through data busses in cabinet 80. Different modes of operation are possible. For example, after polishing the wafer could be moved from output portion 128 to metrology module 120 and, after processing, could be returned to the polish module from which it came, or could be directed to a different polish module to begin a different polishing operation.

Data from metrology module 120 is communicated to the computer control module 78 so as to provide a basis for more accurately estimating an end point to the polishing operation. An estimation of end point may be useful, for example, when initially setting up or calibrating the polishing apparatus. Metrology module 120 may also be employed during a production run for routine "within-run" data acquisition, operations on a regular basis, if desired. Further, data can also be routinely acquired in-between runs, at the conclusion of a wafer polishing operation.

Preferably, multiple automated wafer handlers or robots are provided which extend the full course of the primary module as well as the secondary modules. Accordingly, the automated wafer handlers can access any of the various pieces of equipment employed in the polish system. With the provision of multiple tracks and multiple automated wafer handlers carried on the tracks (with one or more handles per track), it is possible to dedicate one of the automated wafer handlers for so-called "dirty" wafer handling. Such automated handlers are required, for example, in acquiring wafers from the polish module.

Although it is possible to flood the wafers with deionized water or other fluid cleaning media immediately after a polishing operation is concluded, the wafer surfaces still carry a substantial amount of particles or chemical contaminants which must eventually be removed from the wafer surface to allow the wafer production process to continue. It is important to obtain metrology data for the freshly polished wafer, whether or not the wafer is to return to a further polishing operation. For example, the information provided by the metrology equipment may be relied upon "on the fly" to determine whether a polishing end point had been reached, i.e., whether the wafer should be polished further. Heretofore, a thorough cleaning of the wafer was typically required due to the type of metrology equipment employed. However, with the present invention it is possible to employ so-called "wet" metrology equipment which can accommodate "dirty" wafers, without requiring a thorough cleaning step.

The time savings in avoiding the need for a thorough cleaning of the wafer could allow an operator the option of obtaining metrology information before deciding upon further processing steps to which a wafer may be subjected. If issues of chemical contamination arise (as is likely with the advent of future conductor materials) it may not be desirable to directly transfer a wafer directly from the load cups of the various polishing modules. The present invention may be employed to substantial advantage when there are operating concerns of chemical cross contamination between the different chemistries of the various polish modules. For example, the prolonged time delay associated with a thorough wafer cleaning may possibly be avoided with one or more secondary rinse operations. Such rinse operations can be called for on demand, and carried out within the secondary module array. With the flexibility provided by the present invention, several secondary rinse modules can be provided, to accommodate the different chemistries of the polish modules. For example, it is now possible to implement a routine "on the fly" to direct a wafer to a rinse module on its way to and from the metrology module (and indeed, between any two modules of the polish system).

It will now be appreciated that the present invention provides the flexibility and chemical compatibility within a multiple stage polish system. As explained in greater detail herein, each polish module can be made to comprise its own environmental chamber so as to be effectively chemically isolated from neighboring equipment. The transfer of wafers between the polish modules and secondary modules, such as the metrology module 120, plays an important role in maintaining the overall chemical compatibility of the polish system.

As can be seen from FIG. 1, the metrology module 120 can be located in a "remote" portion of apparatus 10. With benefit of cleaning and spin-dry secondary modules, it is possible to use dry metrology equipment in place of, or in addition to, wet metrology instrumentation. Substantial benefits can be obtained by integrating dry metrology devices in module 120, and linking the dry metrology devices by data links in cabinet 80 to control computer 78 to provide within-run and in-between run adjustments to process control parameters. Thereafter, the wafer could be moved to wafer support portion 116 shown in FIGS. 1 and 2.

Figure 4:
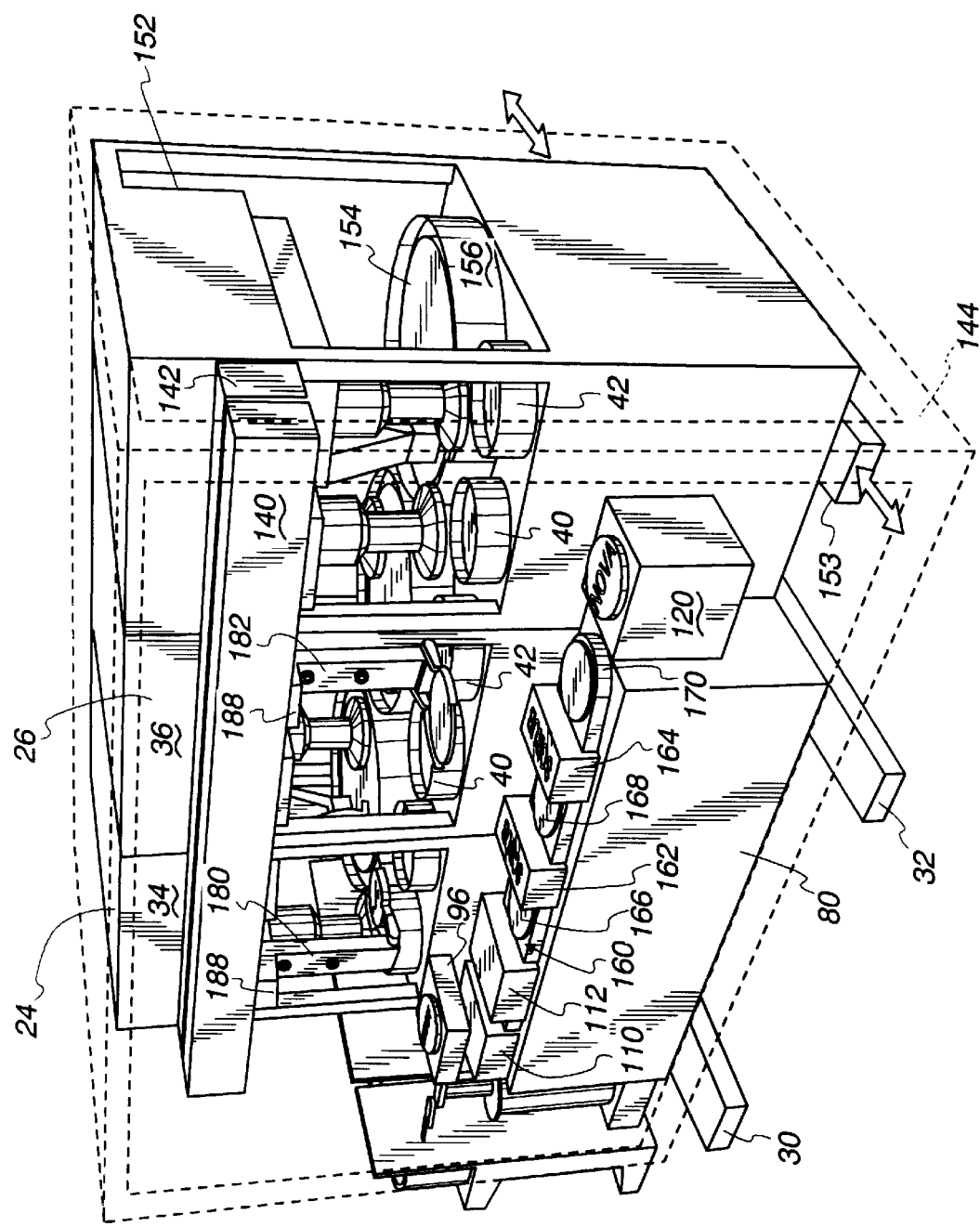
FIG. 4 is a second perspective view thereof.
Figure 5:
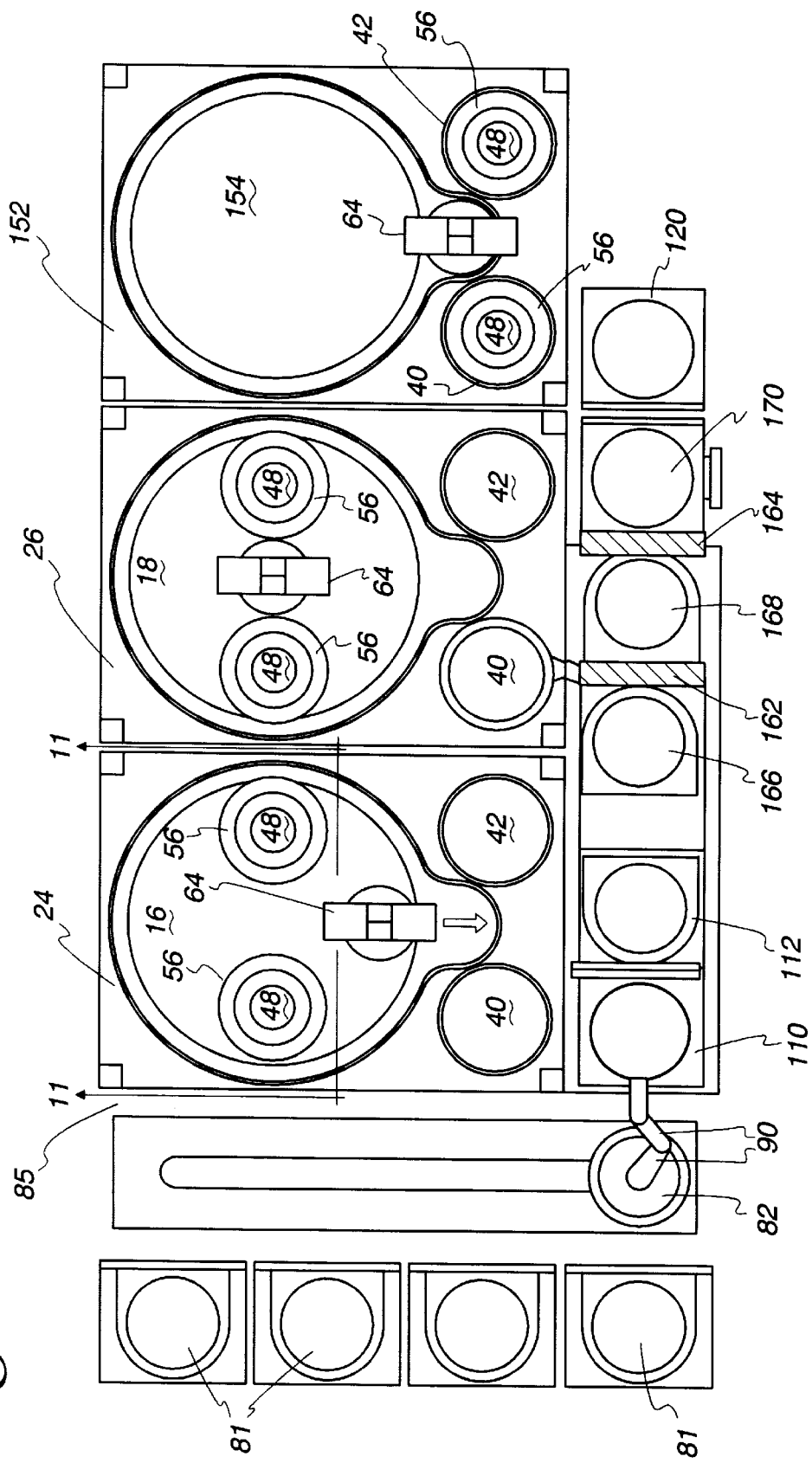
FIG. 5 is a top plan view thereof.

Turning now to FIGS. 3–5, polishing apparatus generally indicated at 150 includes many of the features described above with regard to apparatus 10. In the preferred embodiment, a third polish module, generally indicated at 152, is added to the polish modules 24, 26, described above. Preferably, the third polish module 152 is similar in construction to the aforementioned polish modules 24, 26.

For example, polish module 152 includes a polishing surface 154 mounted within an outer containment frame 156. If desired, polishing module 152 can have a single polishing position mounted therein. Preferably, polish module 152 includes a pair of wafer gantries 48 with wafer carriers 56, as in the afore-described polish modules 24,26. A surface conditioning gantry 64 is also provided in polish module 52 and is movable back and forth across the polishing surface to provide needed conditioning, A pair of wafer loads cups 40, 42 are located adjacent overhead tracks 140, 142 for mounting automated wafer handlers 180, 182.

As can be seen, for example, in FIGS. 3 and 4, the tracks 140, 142 extend across the forward surfaces of the polishing modules, being located above the load cups 40, 42 of the polish module and the wafer access points of the wafer support portions of secondary module array 100. With reference to FIG. 3, this overhead mounting arrangement allows the automated wafer handling or robot arms 180, 182 to traverse substantially the entire extent of the polish modules and the secondary modules. As shown, for example, in FIG. 3, robot 180 is operated so as to move a wafer into the polish modules while robot 182 is operated to move the wafers above the wafer access points or wafer support surfaces of secondary module array 100.

The secondary module array 100 is illustrated in FIG. 3 with an optional arrangement preceding the rinse module 112 and spin-rinse-dry module 110, described above. In the arrangement of FIG. 3, a combined two-stage scrub module, generally indicated at 160, includes two scrub portions 162, 164 located between wafer support portions 166, 168, 170. If desired, the secondary module array shown in FIGS. 1 and 2, or other types of arrays, could be substituted for that shown in FIG. 3.

The three-polishing-module arrangement shown in FIGS. 3–5 illustrates the advantages of having independent modular construction not only of the secondary modules, but also of the polish modules. For example, if desired, different wafer chemistries can be introduced by exchanging polish modules, or, if needed, additional polish modules could be readily added to the arrangements shown herein. As can be seen, for example, in FIG. 4, the third polishing module 152 is mounted on rails 153 for easy slide-in/slide-out movement. In the installed position illustrated in FIGS. 3–5, the third polishing module 152 is connected to the common "backbone" utility supply system incorporated in cabinet 80.

Figure 22:
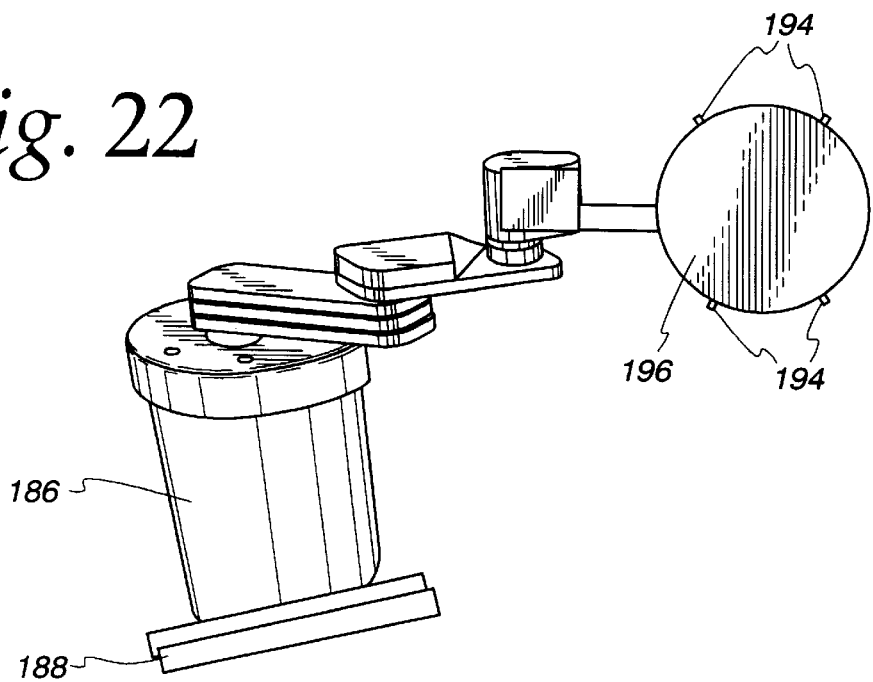
FIG. 22 is a perspective view showing an automated wafer handler.

Refereeing to FIG. 4 and additionally to FIGS. 22–24, the automated wafer handlers or robots 180, 182 are preferably of identical construction and include a vertically extending body portion 186 containing a track member 188 at one end, for travel along track 140 or 142 in the direction of arrow 190. Rotary drive apparatus located in member 188 rotates body 186 along a vertical axis. Wafer edge grippers 194 are movable toward and away from one another to selectively engage or release a wafer 196.

Figure 23A:
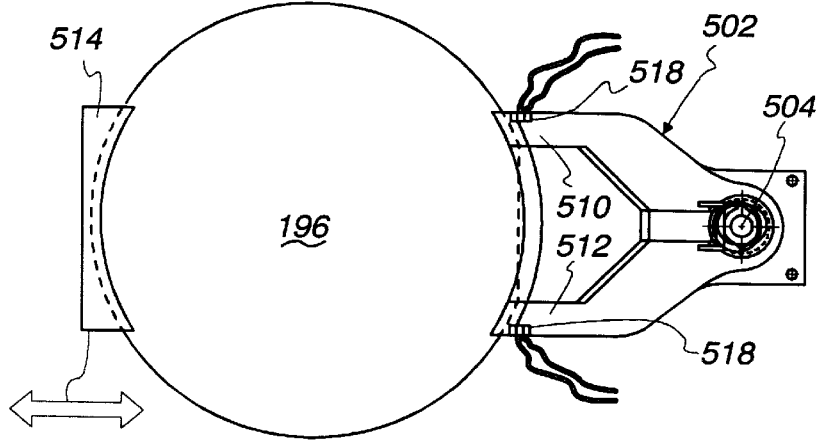
FIGS. 23a, 23b show a fragmentary top plan view and a side elevational view of the end effector for the automated handler.
Figure 23B:
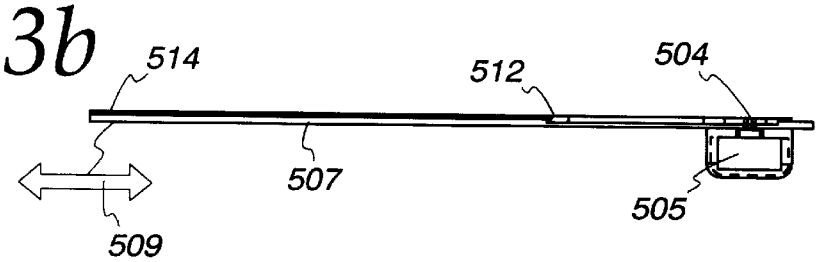

FIGS. 23 and 24 show alternative end effectors for use with the robots. Typically, the end effectors are carried at the end of a series of pivotally interconnected telescoping arms shown, for example, in FIG. 22. Referring to FIGS. 23a, 23b an end effector 502 is rotationally mounted at its inner end, at 504. Three wafer edge grippers 510–514 are employed, with edge grippers 510, 512 including pressure sensitive feedback circuit elements 518. With reference to FIG. 23b, a linear actuator mechanism (not shown) is located within housing portion 504. The outer edge gripper 514 is mounted on a support element 507 which reciprocates back and forth in the direction of arrow 509. The edge gripper 514 is shown in the closed or wafer-gripping position. When removal of the wafer is desired, the linear actuator mechanism in housing 505 is energized so as to extend support 507, moving edge gripper 514 away from edge grippers 510, 512.

If desired, the edge grippers 510, 512 can be combined to form a single arcuate-shaped gripping member.

Figure 24A:
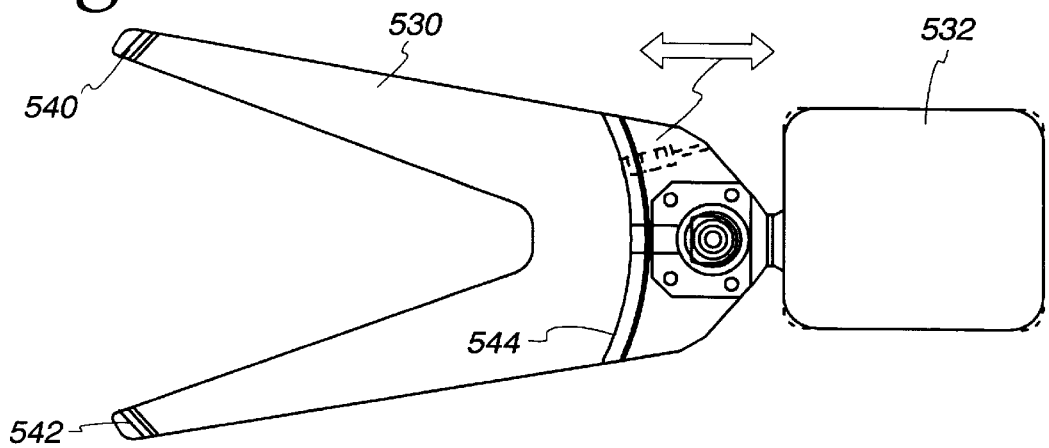
FIGS. 24a, 24b show an alternative end effector for the automated wafer handler.
Figure 24B:
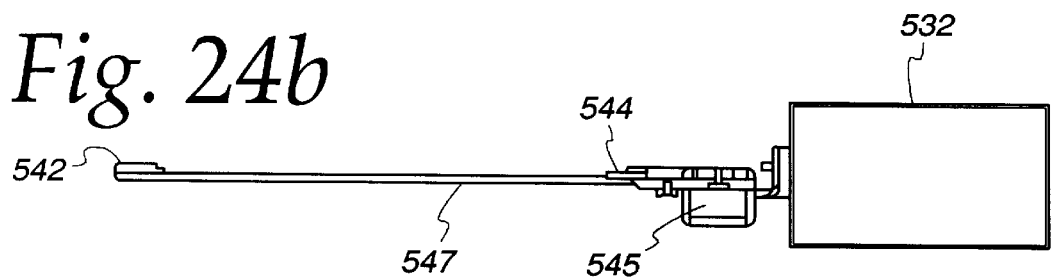

FIG. 24 shows an alternative end effector design where a V-shaped paddle member 530 includes wafer edge grippers 540–544. The end effector shown in FIGS. 24*a*, 24*b* includes a linear actuator housed in housing 545 and which operates to extend support 547 on which edge grippers 540, 542 are mounted. In a preferred embodiment, the V-shaped panel member 530 comprises the support 547. As the linear actuator is energized, edge grippers 540, 542 are together moved toward and away from the remaining edge gripper 544. As shown in FIG. 3, for example, with wafer grippers 194 in a horizontal position, wafers are oriented for ready transfer with load cups 40, 42 of the polish modules, and with the wafer support surfaces located at the various wafer access points in secondary module array 100. In the vertical orientation, the wafers and robot body 186 present a minimal profile to facilitate rapid undisturbed movement along the face of the polish modules, thus reducing unintentional contact during wafer transport, and shrinking the overall "footprint" needed to accommodate the polishing apparatus according to the principles of the present invention.

With reference to FIG. 5, polish modules according to the principles of the present invention provide a flexibility of operation not only of the internal polishing mechanisms, but also the internal conditioning mechanisms which operate to maintain the profile of the polishing surface. For example, polish module 152 shows the conditioning gantry 64 at one end of its path of travel, adjacent the load cups 40, 42. The wafer carriers 56 of the wafer gantries 48 are located above the load cups 40, 42 in a wafer acquisition or wafer discharge position (depending upon the particular moment in the wafer polishing cycle). In wafer polish module 26, the conditioning gantry 64 has been moved to the center of the platen arrangement and, if desired, could be stored at that point since ample clearance is provided for wafer carriers 56 of the wafer gantries 48.

In polish module 24, the conditioning gantry 64 is shown in an intermediate operating position, being moved away from the center of polish platen 16, traveling toward the outer periphery of the polish platen. In this manner, the entire surface of polish platen 16 is treated without interrupting polishing of the wafers in carriers 56 which remain in contact with the polishing surface.

Although it is desirable to conduct a surface conditioning operation on the surface polish platen while a polishing operation is ongoing, provision may be made such that either the pad conditioner carried by gantry 64 or the wafers carried by carriers 56 in gantries 48 are placed in contact with the platen arrangement at a given time. If desired, the conditioning apparatus carried by gantry 64 could be elevated above platen arrangement 18 while wafers in carriers 56 are pressed against the platen arrangement to carry out a polishing operation. Alternatively, the wafers in carriers 56 could be elevated, held above platen arrangement 18, while a conditioning operation is being conducted, with conditioning apparatus carried on gantry 64 pressed into contact with the polish platen, in a known manner of pad conditioning.

The FIG. 5, polish modules 24, 26 and 152 are illustrated for a simultaneous polishing capability, where both wafers are simultaneously processed. However, if desired, each wafer carrier of a polish module can be independently operated in a staggered operating mode. Thus, while a polishing operation is being conducted with one of the wafer carriers of a polish module, the other wafer carrier of the same polish module can travel to load cup 40 or 42, to either drop off a polish wafer or acquire a wafer for a subsequent polishing operation. While polishing of the other wafer carrier continues, a newly acquired wafer can be brought into contact with the polishing surface as the polishing surface is rotated. Thus, continuous staggered polishing operations can be conducted without stopping the polishing surface.

As indicated above, the wafer carriers are mounted on gantries 48 for movement in an "X-Y" direction indicated by the arrows assigned to the left-hand carrier in polishing module 24. With reference to FIG. 11, a wafer gantry 48 is shown mounted on tracks 210 for "X" direction movement back and forth from the load cups to the polishing surface, in directions generally perpendicular to the front faces of the polish module. An orthogonal, "Y" direction movement is provided by tracks 212. A shaft 214 is extendable in a vertical direction, toward and away from platen assembly 12. Preferably, the wafer gantry 48 includes a shaft 214 mounted for vertical reciprocation within a spindle 219. A carrier 56 is mounted at the lower end of shaft 214. Carrier 56 is preferably of conventional design, operating to provide support for wafers during a polishing operation. As indicated in FIG. 11, the wafer gantry 48 is mounted on track supports 49 to an upper portion 51 of support frame 53.

A slider 211 slides within X-direction track 210. Similarly, the Y-direction slider 213 slides back and forth within Y-direction track 212 to provide Y-direction displacement for the wafer gantry and hence the carrier 56.

It may be desirable during the polishing operation to move the wafer about the working surface of the platen assembly, and this can be done by combined X and Y displacements. However, if desired, a swing arm may be mounted at the lower end of the wafer gantry.

Figure 6:
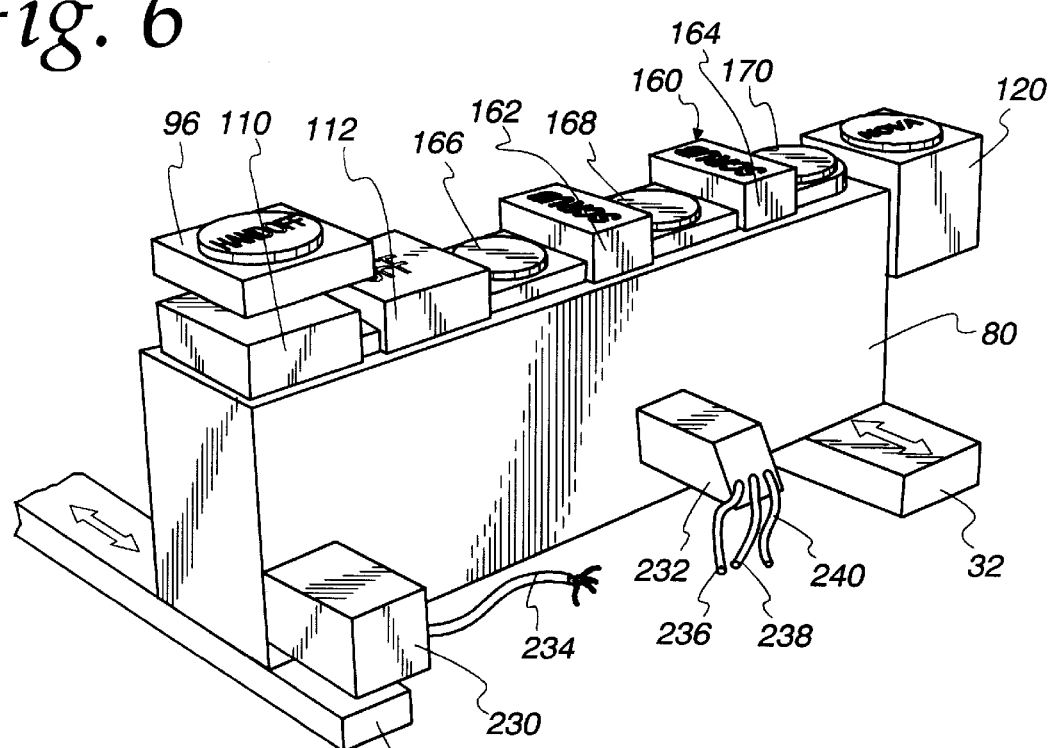
FIG. 6 is a perspective view of a secondary module.

Turning now to FIG. 6, the secondary module array 100 is shown in greater detail. Cabinet 80 includes junction boxes 230, 232 mounted for movement with cabinet 80 as the cabinet is moved back and forth along tracks 30, 32. Junction box 230 provides connection for data bus utilities. A data connection cable 234 includes a plurality of electrical conductors for transmission of data signals between polish modules and secondary modules connected to bus work internal to cabinet 80 and to control systems, including computer control 78, located outside the cabinet 80. Junction box 232 provides coupling to other utility sources required by the polish modules and secondly modules. Included, for example, are conduit 236 for coupling to an electrical power source, conduit 238 for coupling to a pressurized air source, and conduit 240 fir coupling to a source of deionized water. An additional conduit not shown in FIG. 6, for purposes of clarity, for connection to a source of slurry or other chemical processing component. Other utility sources can be added as needed to connections within cabinet 80 to provide necessary requirements for the polishing modules and secondary modules.

Figure 7:
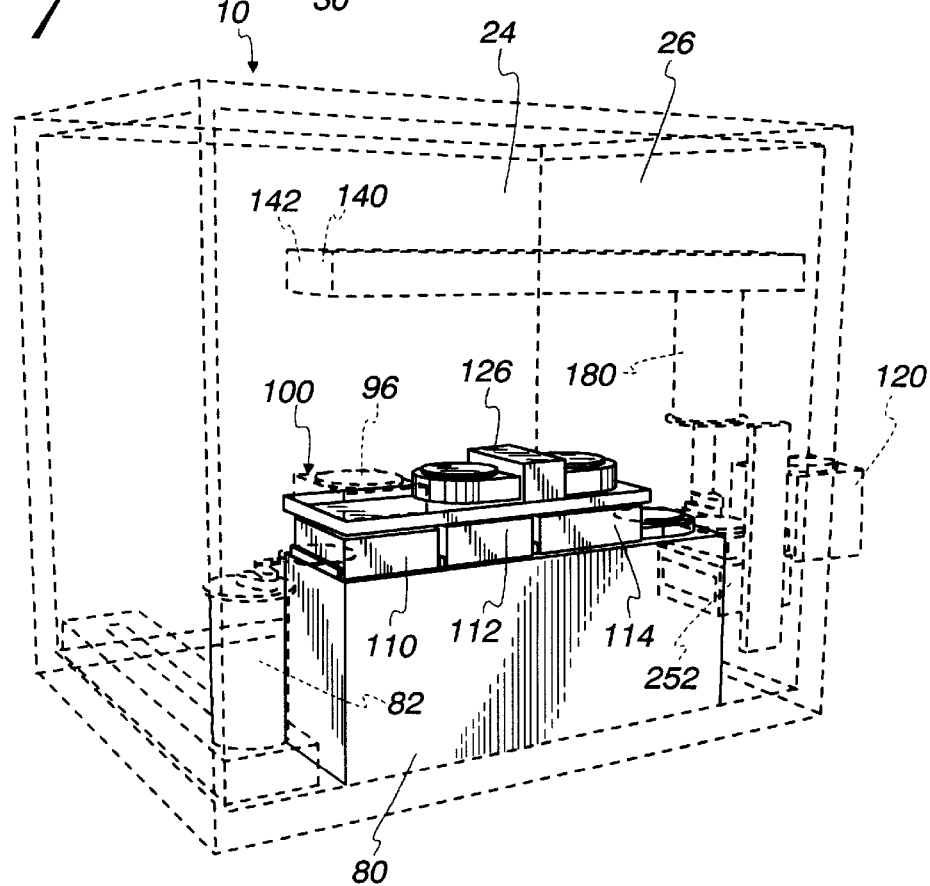
FIG. 7 is a fragmentary perspective view of an alternative secondary module.
Figure 8:
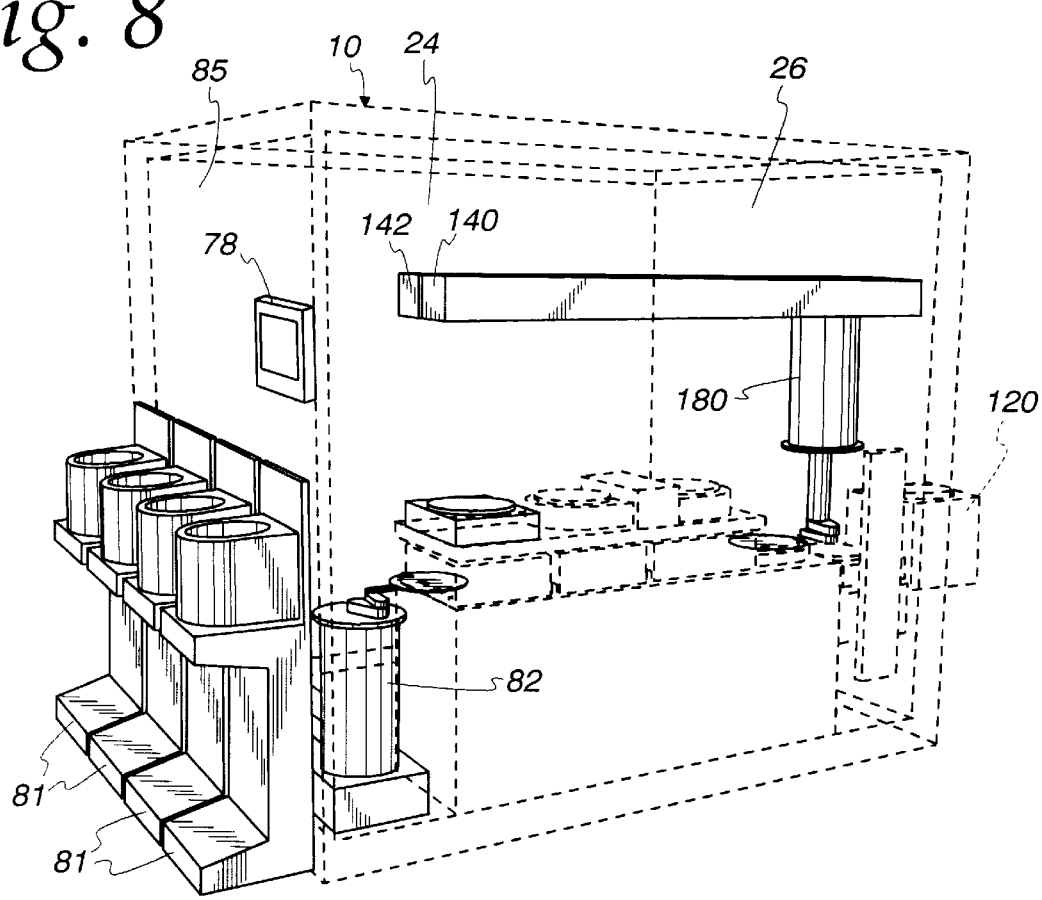
FIG. 8 is a fragmentary view showing the automation components associated with FIG. 1.
Figure 10:
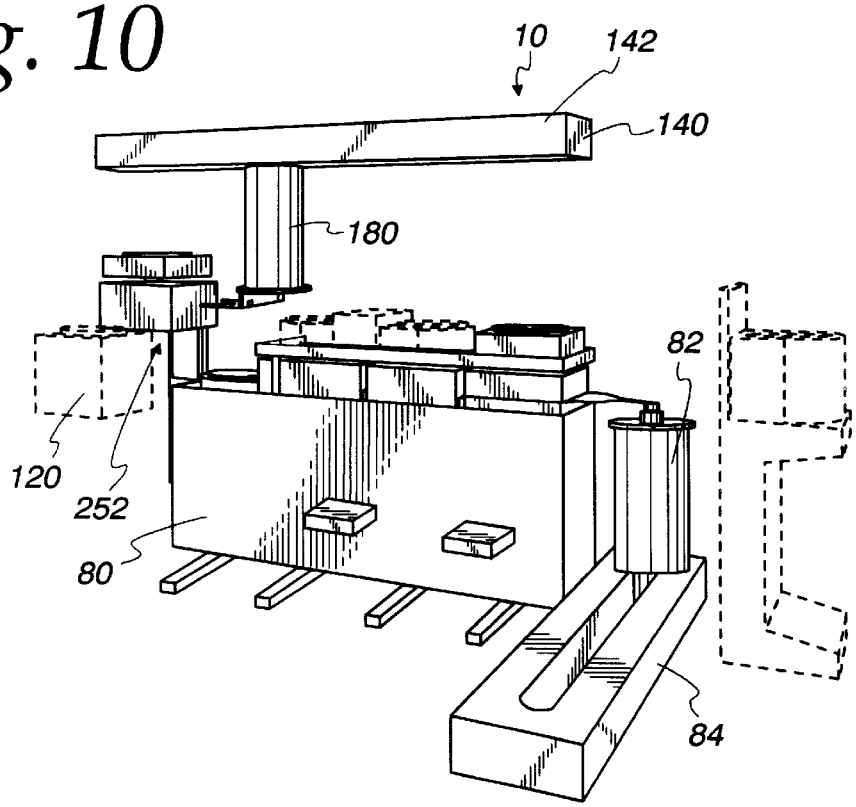
FIG. 10 is a fragmentary perspective view showing yet another sequence of operation.

FIG. 7 is a fragmentary perspective view showing the secondary module arrangement 100 of FIGS. 1 and 2. The wafer support module 96 and metrology module 120 are indicated in phantom, for drawing clarity. The overhead mounting tracks 140, 142 for the automated wafer handlers or robots 180, 182 are also shown in phantom. Robot 82 is shown withdrawing a wafer from within the spin-rinse-dry module 110 (see also FIG. 10). FIG. 7 also shows an optional module 252 located in front of the input or wafer holding surface 116 of scrub module 114. Module 252, mounted on an elevator mechanism (see FIG. 10), preferably includes a wafer traction means to accept a wafer from module portion 116, drawing the wafer into module 252 for processing. It is generally preferred, however, that array 100 be limited to a single linear array of secondary modules and, as indicated in FIG. 10 module 252 may be located between end module 120 and the remainder of array 100. FIG. 8 shows further details of apparatus 10. For example, computer control module 78 is shown mounted above and adjacent storage modules 81, located at a point remote from the polishing environment within modules 24, 26.

Figure 9:
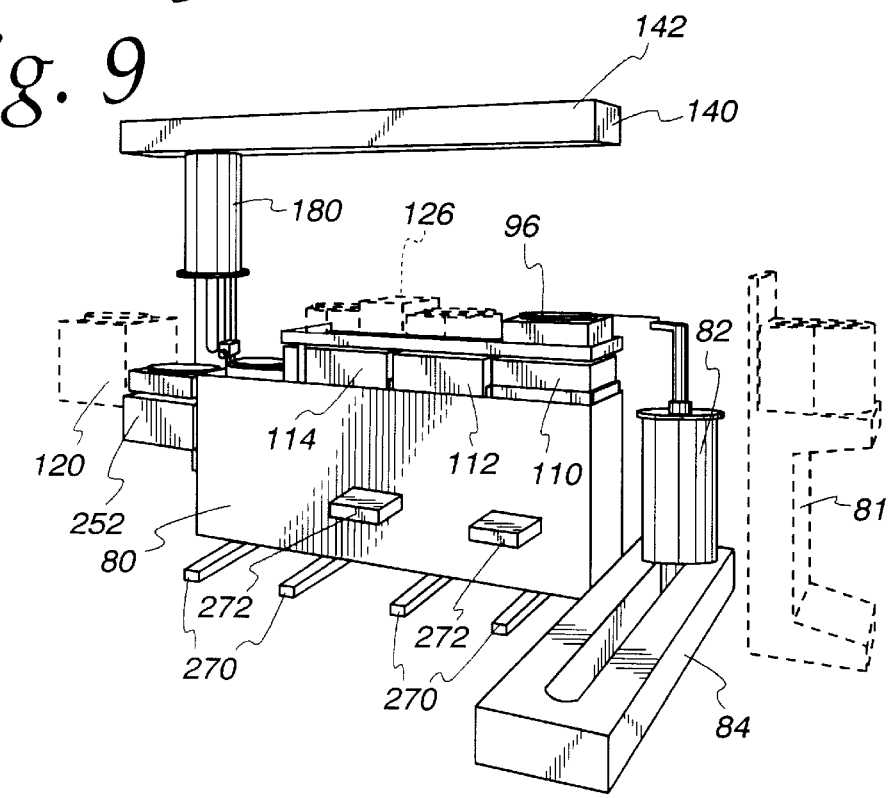
FIG. 9 is a fragmentary perspective view showing a different sequence of operation.

FIGS. 9 and 10 show the arrangements of FIGS. 7 and 8 from a rear perspective, i.e., from behind the polish modules. Robot 82 is shown depositing a wafer on module 96, having withdrawn the wafer from storage module 80. A plurality of tracks 270 provide mounting for the polish modules, for movement toward and away from connector boxes 272 used to couple the polish modules to utility sources and data buses located within cabinet 80.

Figure 14:
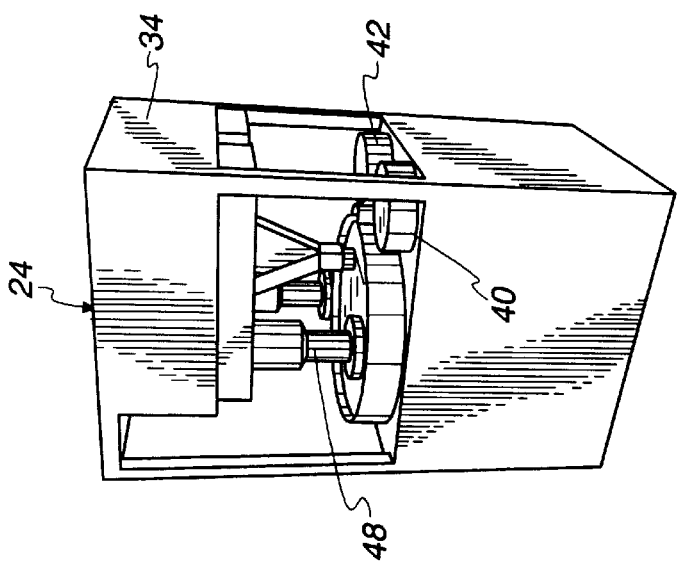

Turning now to FIGS. 14–18, the various stages of operation of an individual polish module are illustrated. FIG. 14 shows conditioning gantry 64 being advanced to an operating position over working surface 16 in preparation for carrying out a conditioning operation. Polish module 24 is provided with side walls 300. The openings in side wall 300 and in the back wall visible in FIG. 14 are enclosed by an environmental seal, as may be required. For example, glass or plastic barriers or, alternatively, air curtain seals, may be employed to completely enclose the interior of the polishing module.

Figure 15:
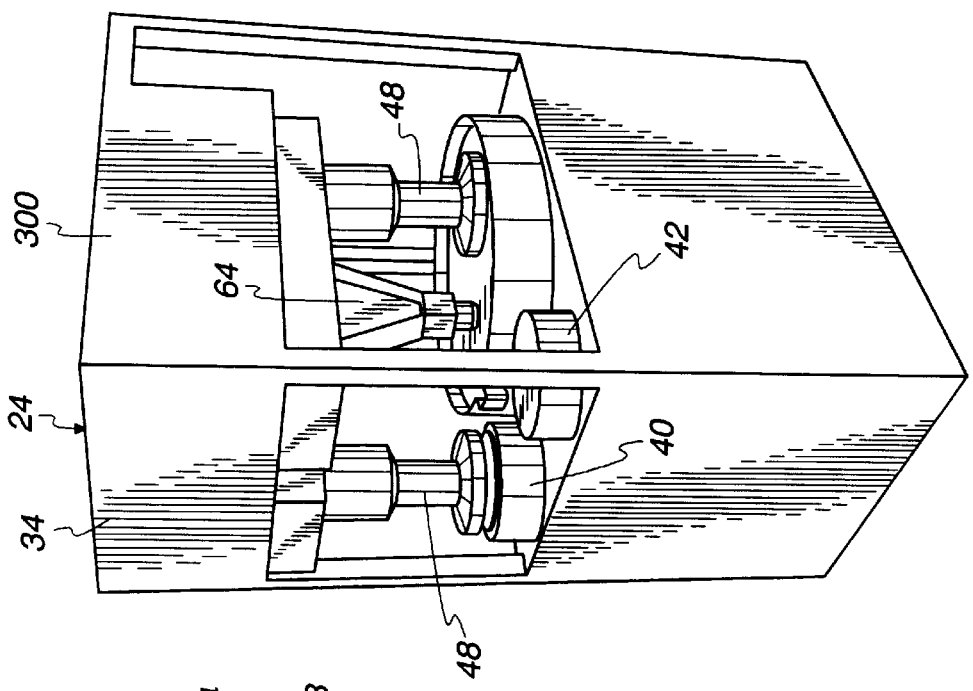
FIGS. 15–18 are perspective view of polish modules shown in different phases of operations.
Figure 16:
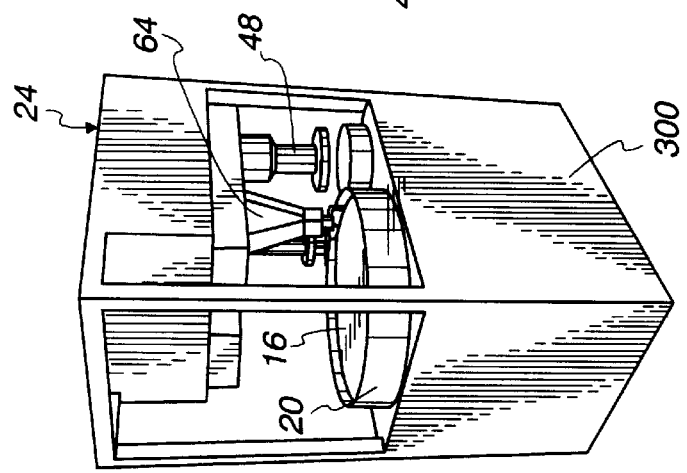
Figure 17:
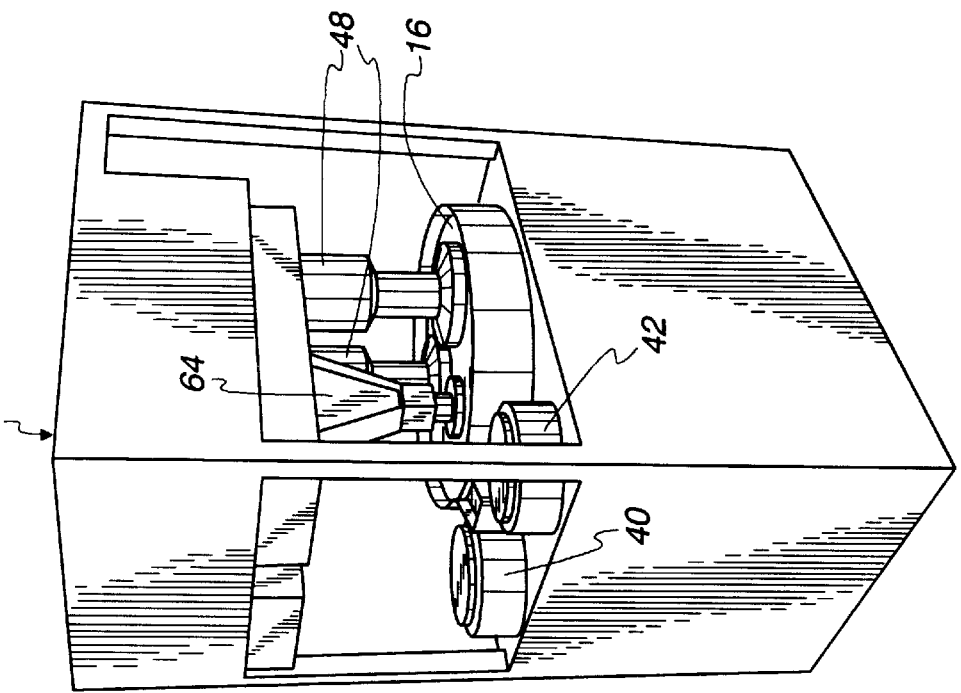
Figure 18:
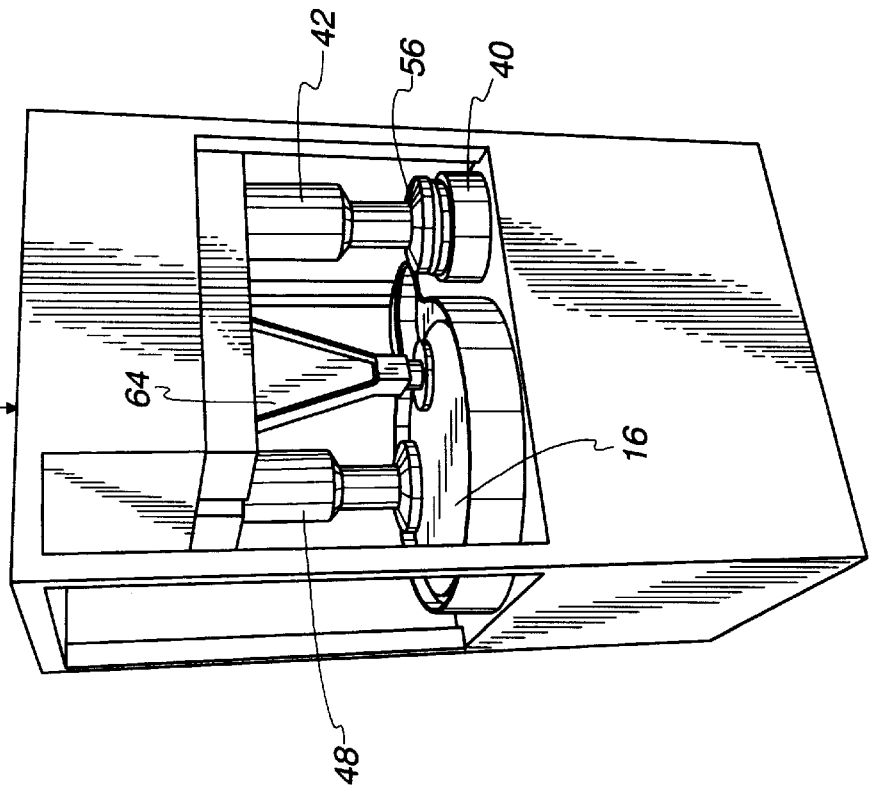

In FIG. 14, wafer gantries 48 are shown in position over their respective load cups. In FIG. 15, one of the wafer gantries has been moved over the polishing surface while the conditioning gantry 64 has been moved to its preferred rest position, adjacent the load cups 40, 42. In FIG. 16, both wafer gantries 48 are moved in position over the polishing surface but are retracted above the polishing surface. The conditioning gantry is moved into position over the polishing surface and, accordingly, it is desired to at least temporarily maintain the wafer carriers removed from the polishing surface. FIG. 17 shows the operating conditions similar to FIG. 15, with conditioning gantry 64 advanced to the polishing surface, along with one of the wafer gantries. Finally, FIG. 18 shown an operating condition similar to that of FIG. 16 with both wafer gantries 48 in position over polishing surface 16.

Figure 19:
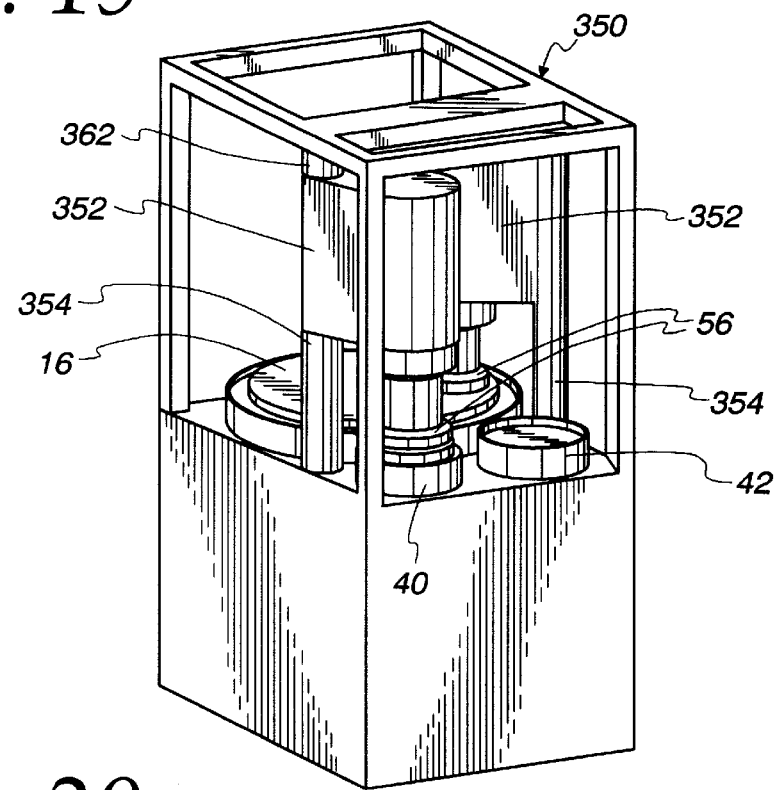
FIG 19 is a perspective view of an alternative polish module.
Figure 20:
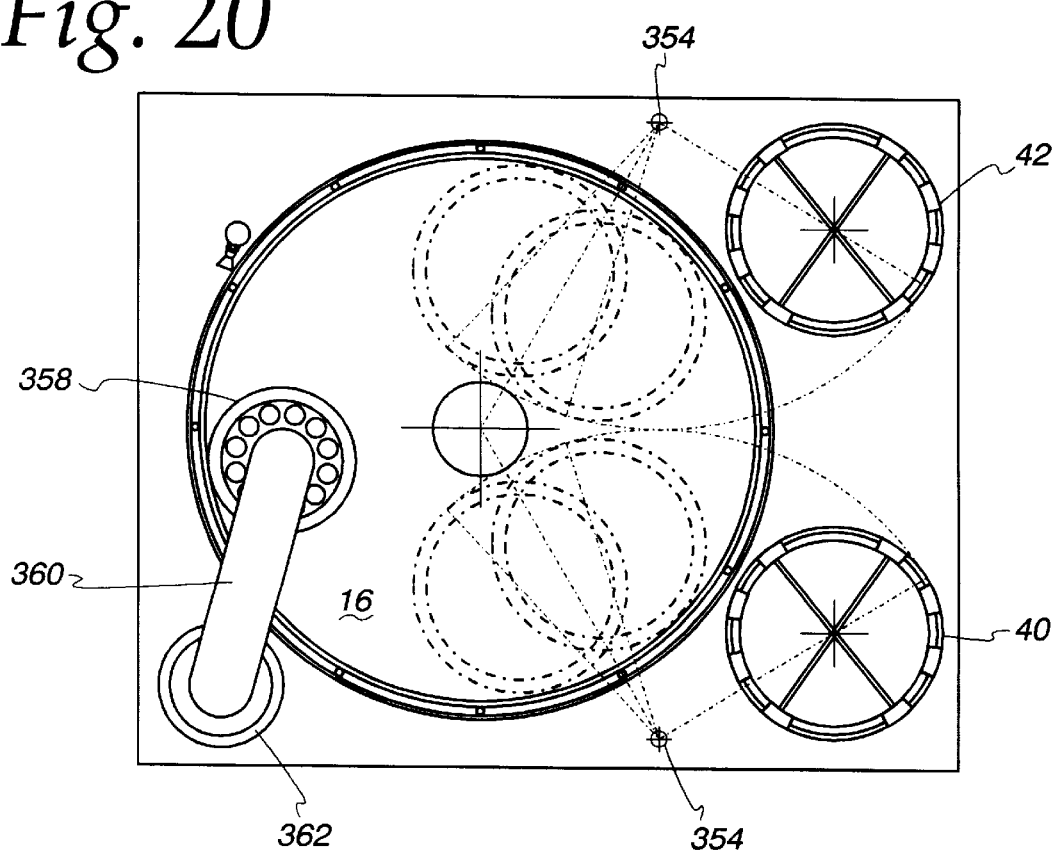
FIG. 20 is a top plan view thereof.

Turning now to FIGS. 19 and 20, an optional polish module is indicated at 350. Included in the polish module is a pair of wafer gantries 352 swingingly mounted on respective support columns 354. Carriers 56 are swung between working surface 16 and load cups 40 or 42. FIG. 20 shows surface conditioning device swingingly carried on an arm 360, pivotally connected to mounting column 362. Conditioning device 358 is swung from an operating position shown in FIG. 20, over polishing surface 16, to a remove position raised above working surface 16 or swung to one side so as to clear the working surface.

Figure 21:
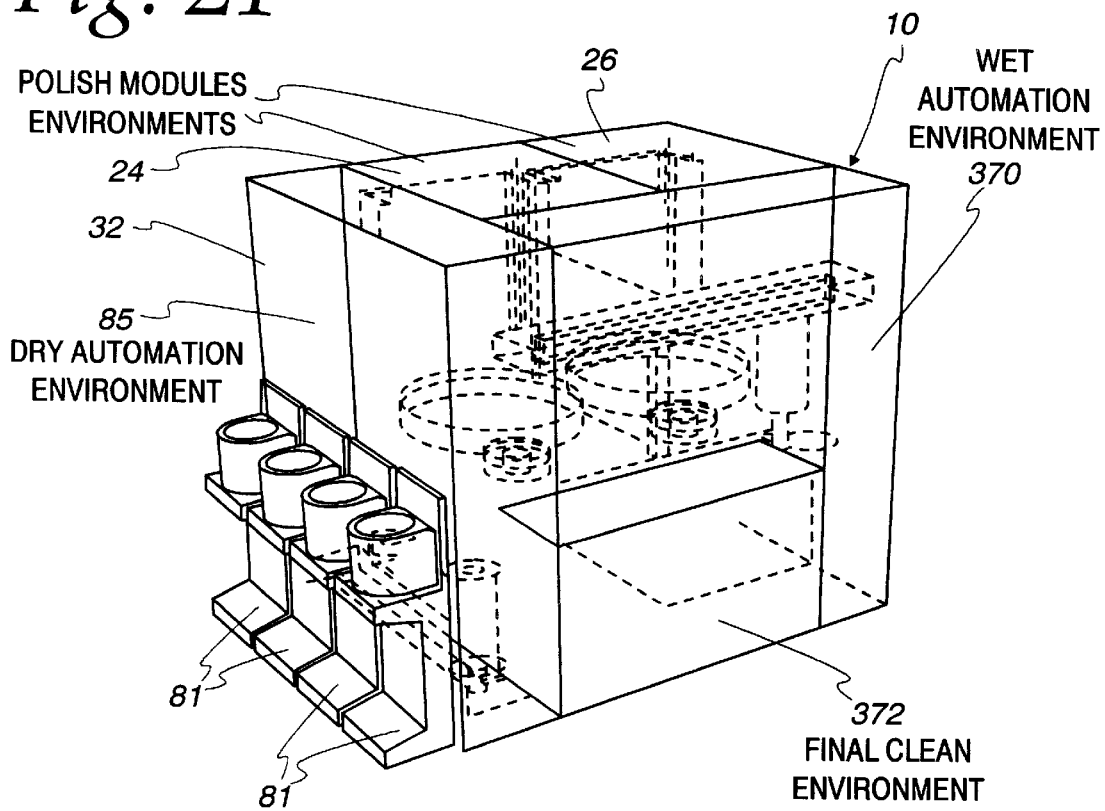
FIG. 21 is a perspective view showing different environmental zones of polishing arrangements according to principles of the present invention.

FIG. 21 shows the preferred environmental zones created by internal walls within apparatus 10. Polishing modules 24, 26 are each independently environmentally enclosed, as described above. In addition, a dry automation environment 32 is maintained between the storage modules 81. The dry automation environment 81 encloses the storage robot 82 and the computer control module 78 (not shown). A wet automation environment 370 encloses the automated wafer handlers or robots which traverse the polish modules and secondary modules.

A final clean environment indicated by reference numeral 372 finds a physical realization, for example with reference to FIG. 1, in the enclosed environments of the final secondary modules 110–114. Cabinet 80 and its interior components are also included within environment 372, and maintained separate and apart from the wet automation environment and the polish module environments.

As will be appreciated, the modular construction afforded by the present invention contributes to the ready arrangement of defined environmental regions within apparatus 10, while providing flexibility of configuration as polish modules and secondary modules are introduced, removed and exchanged in apparatus 10.

Certain variations are possible in the arrangements described above. For example, the polish platen assemblies are illustrated having a generally circular form, being rotated about a central axis. If desired, the rotating polish platens can be readily replaced by polish platens in tape pad or belt form which undergo linear motion. Further, linear belts, pads and tapes may be employed in the secondary modules. For example, a secondary module may employ an abrasive tape to provide desired surface conditioning of a wafer before entering a polishing operation or possibly within a polishing run.

The drawings and the foregoing descriptions are not intended to represent the only forms of the invention in regard to the details of its construction and manner of operation. Changes in form and in the proportion of parts, as well as the substitution of equivalents, are contemplated as circumstances may suggest or render expedient; and although specific terms have been employed, they are intended in a generic and descriptive sense only and not for the purposes of limitation, the scope of the invention being delineated by the following claims.

What is claimed is:

1. Wafer polishing apparatus, comprising:
   a linear array of polish modules having respective wafer support arrangements independently operable with respect to one another, the linear array of polish modules having opposed first and second ends;
   a linear array of secondary modules for treating exposed surfaces of said wafers, located alongside said linear array of polish modules, said secondary modules independently operable with respect to one another and the linear array of secondary modules having opposed first and second ends, with the first end adjacent the first end of said linear array of polish modules; and
   an automated wafer handling means for transporting wafers between modules of said linear arrays of said polish modules and modules of said linear array of said secondary modules.

2. The wafer polishing apparatus of claim 1 further comprising superstructure having an upper end and surrounding said linear array of polish modules and wherein said second automated wafer handling means is suspended from at least one track mounted to the upper end of said superstructure, above said wafer support arrangements and said secondary modules.

3. The wafer polishing apparatus of claim 2 wherein said second automated wafer handling means include at least two wafer grippers which travel back and forth along said at least one track, along both said linear array of polish modules and said linear array of secondary modules.

4. The wafer polishing apparatus of claim 3 wherein at least one of said first and said second automated wafer handling means includes an elongated arm carrying a plurality of edge grippers, with at least one edge gripper mounted for linear reciprocating movement toward and away from the other edge grippers and is moved by linear actuator drive means located at one end of said arm.

5. The wafer polishing apparatus of claim 3 wherein said second automated wafer handling means includes a first robotic end effector for selectively acquiring and selectively releasing wet wafers and a second robotic end effector for selectively acquiring and selectively releasing dry wafers.

6. The wafer polishing apparatus of claim 3 wherein said wafers include edges and said first and said second robotic end effectors grip said wafer edges to acquire said wafers.

7. The wafer polishing apparatus of claim 1 wherein said linear array of secondary modules includes a metrology module for performing metrology tests on said wafers.

8. The wafer polishing apparatus of claim 7 wherein:
said wafer polishing apparatus further includes computer control means coupled to said polish modules for automated control of said polish modules; and
said metrology module performs dry metrology tests on said wafers and includes data output means coupled to said automated control means.

9. The wafer polishing apparatus of claim 1 wherein said linear array of secondary modules includes modules for drying said wafers.

10. The wafer polishing apparatus of claim 1 wherein said linear array of secondary modules includes modules for rinsing said wafers.

11. The wafer polishing apparatus of claim 1 wherein said linear array of secondary modules includes modules for scrubbing said wafers, including a pair of rollers forming a nip through which said wafer is passed.

12. The wafer polishing apparatus of claim 1 wherein said linear array of secondary modules includes modules for buffing said wafers.

13. The wafer polishing apparatus of claim 1 wherein said linear array of secondary modules includes modules for inverting said wafers.

14. The wafer polishing apparatus of claim 13 wherein said modules for inverting said wafers rotates said wafers about an axis passing across a surface of said wafer.

15. The wafer polishing apparatus of claim 1 further comprising a polishing supply means common to all of said polish modules for supplying utility inputs to said polish modules, said utility inputs including at least one of said electrical power, compressed air, deionized water source, polishing slurry source, chemicals, and data communication busses.

16. The wafer polishing apparatus of claim 15 wherein said polish modules are mounted for sliding movement toward and away from said polish supply means.

17. The wafer polishing apparatus of claim 1 wherein said polish modules are enclosed to define environments separate and independent from one another.

18. The wafer polishing apparatus of claim 1 further comprising a secondary supply means common to all of said secondary modules for supplying utility inputs to said secondary modules, said utility inputs including at least one of said electrical power, compressed air, deionized water source, chemical source, and date communication busses.

19. The wafer polishing apparatus of claim 18 wherein said secondary supply means is mounted for sliding movement between servicing and operating positions.

20. The wafer polishing apparatus of claim 1 wherein said polishing modules each have a single one of said wafer support arrangements, at least two wafer-receiving load cups, at least two wafer carriers and at least two carrier actuating means for moving said wafer carriers between said load cups and said wafer support arrangement and for pressing said wafer carriers in contact with said wafer support arrangements to apply polishing pressure to wafers carried by said wafer carriers.

21. The wafer polishing apparatus of claim 20 wherein said carrier actuating means includes carrier tracks for suspending said carriers above said wafer support arrangement.

22. The wafer polishing apparatus of claim 21 wherein said carriers are movable back and forth along said carrier tracks, between said load cups and said wafer support arrangement.

23. The wafer polishing apparatus of claim 21 wherein said carriers are movable in multiple directions in planes parallel to said wafer support arrangement.

24. The wafer polishing apparatus of claim 20 wherein said carriers of each polish module are independently movable in staggered polishing operations where one wafer is received by one wafer support arrangement while another wafer is being polished.

25. The wafer polishing apparatus of claim 20 wherein said carriers of each polish module are movable in unison for simultaneous polishing operations.

26. The wafer polishing apparatus of claim 20 wherein said carriers of each polish module are movable to press wafers against and remove wafers from said wafer support arrangement as said wafer support arrangement is continuously rotated.

27. The wafer polishing apparatus of claim 26 wherein said polishing modules further comprise conditioning means for conditioning said wafer support arrangements.

28. The wafer polishing apparatus of claim 27 wherein said polishing modules each have a conditioning actuating means for moving said conditioning means across said wafer support arrangement and for pressing said conditioning means against said wafer support arrangement.

29. The wafer polishing apparatus of claim 27 wherein said conditioning actuating means includes conditioning carrier tracks for suspending said conditioning means above said wafer support arrangement.

30. The wafer polishing apparatus of claim 29 wherein said conditioning means are movable back and forth along said conditioning carrier tracks across the surface of said wafer support arrangement.

31. The wafer polishing apparatus according to claim 1, further comprising:
wafer storage means adjacent the first ends of said linear arrays of said polish modules and said secondary modules; and
automated wafer transport means for transporting wafers between said wafer storage means and the first end of at least one of said linear array of polish modules and said linear array of secondary modules.

* * * * *